(12) United States Patent
Lu et al.

(10) Patent No.: US 8,945,444 B2
(45) Date of Patent: Feb. 3, 2015

(54) HIGH THROUGHPUT IMPRINT BASED ON CONTACT LINE MOTION TRACKING CONTROL

(75) Inventors: Xiaoming Lu, Cedar Park, TX (US); Philip D. Schumaker, Austin, TX (US)

(73) Assignees: Canon Nanotechnologies, Inc., Austin, TX (US); Molecular Imprints, Inc., Austin, TX (US)

( * ) Notice: Subject to any disclaimer, the term of this patent is extended or adjusted under 35 U.S.C. 154(b) by 179 days.

(21) Appl. No.: 12/327,618

(22) Filed: Dec. 3, 2008

(65) Prior Publication Data

US 2009/0140445 A1  Jun. 4, 2009

Related U.S. Application Data

(60) Provisional application No. 61/005,297, filed on Dec. 4, 2007.

(51) Int. Cl.
| | | |
|---|---|---|
| B29C 43/58 | (2006.01) | |
| B29C 43/00 | (2006.01) | |
| B82Y 10/00 | (2011.01) | |
| G03F 7/00 | (2006.01) | |
| B82Y 40/00 | (2011.01) | |
| B29C 43/02 | (2006.01) | |

(52) U.S. Cl.
CPC .......... B29C 43/58 (2013.01); *B29C 2043/5808* (2013.01); *B29C 2043/5841* (2013.01); *B29C 2043/5833* (2013.01); B29C 43/003 (2013.01); *B29C 2043/025* (2013.01); B82Y 10/00 (2013.01); B82Y 40/00 (2013.01); G03F 7/0002 (2013.01)

USPC .................................... 264/40.5; 264/40.1

(58) Field of Classification Search
USPC ............................... 264/40.1, 40.5
See application file for complete search history.

(56) References Cited

U.S. PATENT DOCUMENTS

| | | | |
|---|---|---|---|
| 5,926,690 A | * | 7/1999 | Toprac et al. ................. 438/17 |
| 6,334,960 B1 | | 1/2002 | Willson et al. |
| 6,696,220 B2 | | 2/2004 | Bailey et al. |
| 6,741,335 B2 | | 5/2004 | Kinrot et al. |
| 6,842,229 B2 | | 1/2005 | Sreenivasan et al. |
| 6,871,558 B2 | | 3/2005 | Choi et al. |
| 6,873,087 B1 | | 3/2005 | Choi et al. |
| 6,908,861 B2 | * | 6/2005 | Sreenivasan et al. ........ 438/694 |
| 6,916,585 B2 | | 7/2005 | Sreenivasan et al. |
| 6,922,906 B2 | | 8/2005 | Choi et al. |
| 6,926,929 B2 | | 8/2005 | Watts et al. |
| 6,929,762 B2 | | 8/2005 | Rubin |
| 6,932,934 B2 | | 8/2005 | Choi et al. |

(Continued)

FOREIGN PATENT DOCUMENTS

| | | |
|---|---|---|
| EP | 1605308 | 12/2005 |
| JP | 2005-353858 A | 12/2005 |

(Continued)

OTHER PUBLICATIONS

Choi, Byung-Jin. Innovative Nanoimprint Tools for Optoelectronic Applications. Molecular Imprints Inc. Austin, TX. NTIS. May 1, 2002.*

*Primary Examiner* — Atul P. Khare
(74) *Attorney, Agent, or Firm* — Cameron A. King

(57) ABSTRACT

Systems and methods for controlling velocity of a contact line and height profile between a template and a substrate during imprinting of polymerizable material are described.

12 Claims, 13 Drawing Sheets

(56) References Cited

U.S. PATENT DOCUMENTS

| | | | |
|---|---|---|---|
| 6,951,173 B1* | 10/2005 | Meissl et al. | 101/483 |
| 6,955,868 B2 | 10/2005 | Choi et al. | |
| 6,980,282 B2* | 12/2005 | Choi et al. | 355/72 |
| 6,990,870 B2 | 1/2006 | Choi et al. | |
| 7,019,819 B2* | 3/2006 | Choi et al. | 355/75 |
| 7,060,324 B2 | 6/2006 | Bailey et al. | |
| 7,060,402 B2 | 6/2006 | Choi et al. | |
| 7,071,088 B2 | 7/2006 | Watts et al. | |
| 7,090,716 B2 | 8/2006 | McMackin et al. | |
| 7,098,572 B2 | 8/2006 | Choi et al. | |
| 7,150,622 B2 | 12/2006 | Choi et al. | |
| 7,252,715 B2 | 8/2007 | Watts et al. | |
| 7,270,533 B2 | 9/2007 | McMackin et al. | |
| 7,338,275 B2 | 3/2008 | Choi et al. | |
| 7,365,103 B2 | 4/2008 | Willson et al. | |
| 2002/0150398 A1 | 10/2002 | Choi et al. | |
| 2003/0142288 A1* | 7/2003 | Kinrot et al. | 356/28 |
| 2003/0213382 A1 | 11/2003 | Kendale et al. | |
| 2004/0112861 A1* | 6/2004 | Choi et al. | 216/66 |
| 2004/0141163 A1 | 7/2004 | Bailey et al. | |
| 2004/0149687 A1 | 8/2004 | Choi et al. | |
| 2004/0163563 A1 | 8/2004 | Sreenivasan et al. | |
| 2004/0170771 A1* | 9/2004 | Bailey et al. | 427/421.1 |
| 2005/0061773 A1 | 3/2005 | Choi et al. | |
| 2005/0072757 A1 | 4/2005 | McMackin et al. | |
| 2005/0187339 A1 | 8/2005 | Xu et al. | |
| 2005/0189676 A1 | 9/2005 | Sreenivasan | |
| 2005/0236739 A1 | 10/2005 | Willson et al. | |
| 2005/0260295 A1 | 11/2005 | Choi et al. | |
| 2005/0264132 A1 | 12/2005 | Choi et al. | |
| 2005/0270312 A1 | 12/2005 | Lad et al. | |
| 2005/0274219 A1 | 12/2005 | Choi et al. | |
| 2005/0275125 A1 | 12/2005 | Kawakami et al. | |
| 2005/0275251 A1 | 12/2005 | Choi et al. | |
| 2005/0275311 A1 | 12/2005 | Choi et al. | |
| 2006/0005657 A1 | 1/2006 | Choi et al. | |
| 2006/0062922 A1 | 3/2006 | Xu et al. | |
| 2006/0076717 A1 | 4/2006 | Sreenivasan et al. | |
| 2006/0077374 A1 | 4/2006 | Sreenivasan et al. | |
| 2006/0115999 A1 | 6/2006 | Sreenivasan et al. | |
| 2006/0172031 A1* | 8/2006 | Babbs et al. | 425/385 |
| 2006/0245636 A1* | 11/2006 | Kitamura et al. | 382/149 |
| 2007/0018360 A1 | 1/2007 | Kolesnychenko et al. | |
| 2007/0145639 A1 | 6/2007 | Seki et al. | |
| 2007/0170617 A1 | 7/2007 | Choi et al. | |
| 2007/0190200 A1* | 8/2007 | Cherala et al. | 425/385 |
| 2007/0206169 A1* | 9/2007 | Butler | 355/53 |
| 2007/0246850 A1 | 10/2007 | Schumaker | |
| 2007/0262049 A1 | 11/2007 | Miyajima et al. | |
| 2007/0287081 A1 | 12/2007 | Cherala et al. | |
| 2008/0141862 A1 | 6/2008 | Xu et al. | |
| 2008/0153312 A1 | 6/2008 | Sreenivasan et al. | |
| 2008/0174046 A1 | 7/2008 | Choi et al. | |
| 2008/0199816 A1 | 8/2008 | Choi et al. | |
| 2009/0026657 A1 | 1/2009 | Nimmakayala et al. | |

FOREIGN PATENT DOCUMENTS

| | | |
|---|---|---|
| JP | 2007-137051 A | 6/2007 |
| WO | WO/02/29504 | 4/2002 |

* cited by examiner

HIGH THROUGHPUT IMPRINT BASED ON CONTACT LINE MOTION TRACKING CONTROL

CROSS-REFERENCE TO RELATED APPLICATION

This application claims the benefit under 35 U.S.C. §119 (e)(1) of U.S. Provisional No. 61/005,297, filed on Dec. 4, 2007, which is hereby incorporated by reference.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference.

An imprint lithography technique disclosed in each of the aforementioned U.S. patent publications and patent includes formation of a relief pattern in a formable layer (polymerizable) and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
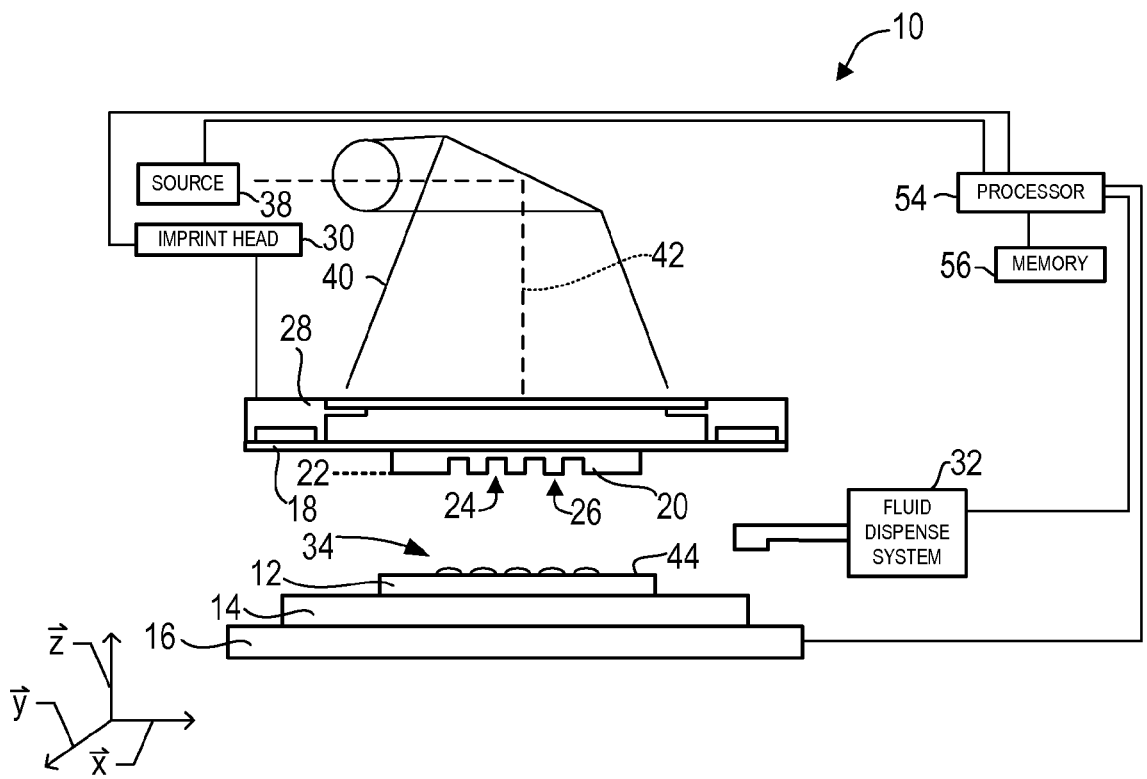
FIG. 1 illustrates a simplified side view of a lithographic system in accordance with an embodiment of the present invention.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Patent No. 6,873,087, which is hereby incorporated by reference.

Substrate 12 and substrate chuck 14 may be further supported by stage 16. Stage 16 may provide motion along the x-, y-, and z-axes. Stage 16, substrate 12, and substrate chuck 14 may also be positioned on a base (not shown).

Spaced-apart from substrate 12 is a template 18. Template 18 may include a mesa 20 extending therefrom towards substrate 12, mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 20 and substrate 12 depending on design considerations. Polymerizable material 34 may comprise a monomer mixture as described in U.S. Pat. No. 7,157,036 and U.S. Patent Publication No. 2005/0187339, all of which are hereby incorporated by reference.

Figure 2:
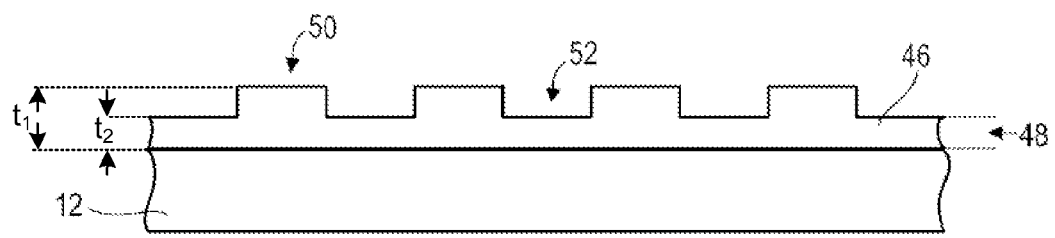
FIG. 2 illustrates a simplified side view of the substrate shown in FIG. 1 having a patterned layer positioned thereon.

Referring to FIGS. 1 and 2, system 10 may further comprise an energy source 38 coupled to direct energy 40 along path 42. Imprint head 30 and stage 16 may be configured to position template 18 and substrate 12 in superimposition with path 42. System 10 may be regulated by a processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., ultraviolet radiation, causing polymerizable material 34 to solidify and/or crosslink conforming to shape of a surface 44 of substrate 12 and patterning surface 22, defining a patterned layer 46 on substrate 12. Patterned layer 46 may comprise a residual layer 48 and a plurality of features shown as protrusions 50 and recessions 52, with protrusions 50 having thickness $t_1$ and residual layer having a thickness $t_2$.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, each of which is hereby incorporated by reference.

Chuck 28 and substrate chuck 14 may be used during imprinting to secure template 18 and substrate 12 respectively. Chuck 28 may be mounted on imprint head 30. Imprint head 30 may be capable of controlling motion in multiple axes. For example, imprint head 30 may be a three-axis imprint head 30 capable of controlling Z, $R_x$ and $R_y$ motions (e.g., tip/tilt motion) by moving to independent $Z_1$, $Z_2$ and $Z_3$ positions. Imprint head 30 may also provide for contact force F between template 18 and substrate 12.

Figure 3A:
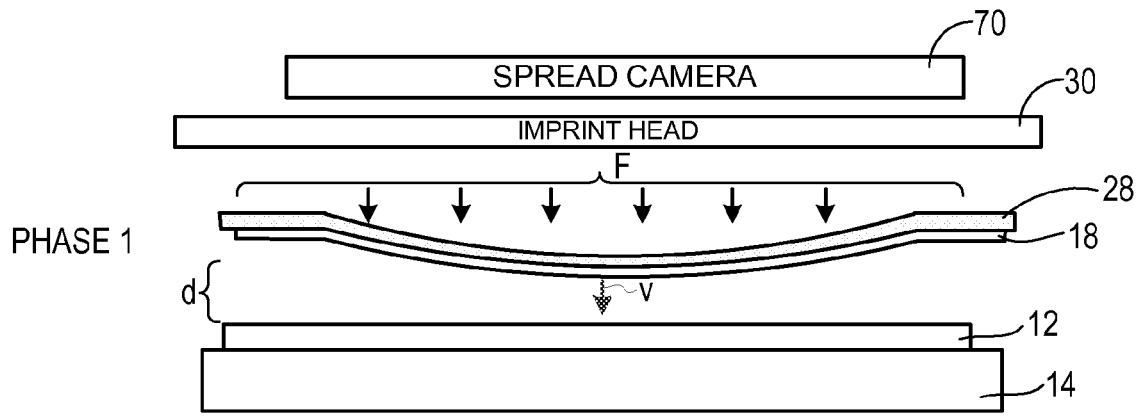
FIGS. 3A-3D illustrate simplified side views of Phases of contact between a template and a substrate.

Generally, there are three phases for imprint head 30 during the imprinting process. During Phase 1, as illustrated in FIG. 3A, contacting transitions and contact force of template 18 to substrate 12 may be controlled to provide a substantially stable interaction between template 18 and substrate 12 while achieving a relatively rapid response.

Imprint head 30 may provide template 18 in free space motion wherein template 18 and substrate 12 may be separated by a distance d. As template 18 moves towards substrate 12, pressure between template 18 and substrate 12 may increase as the gas flow rate may be limited by the distance between template 18 and substrate 12. The force detected by imprint head 30 may be dependent on the pressure distribution which is a function of the velocity of imprint head 30 and the distance between template 18 and substrate 12. If the distance d between template 18 and substrate 12 is greater than approximately 10 μm, the resistance force generated by the air may be of a relatively low magnitude, and as such, incapable of being detected even if template 18 moves towards substrate 12 at velocities of approximately 3 mm/s.

Imprint head 30 moves template 18 at a velocity v towards substrate 12 (e.g., 3 mm/s) and decreases the distance between template 18 and substrate 12 to less than approximately 10 μm. At this Phase, several Newtons of force (e.g., air resistance) may be measured. This force may be reduced by decreasing the moving velocity of imprint head 30.

Figure 3B:
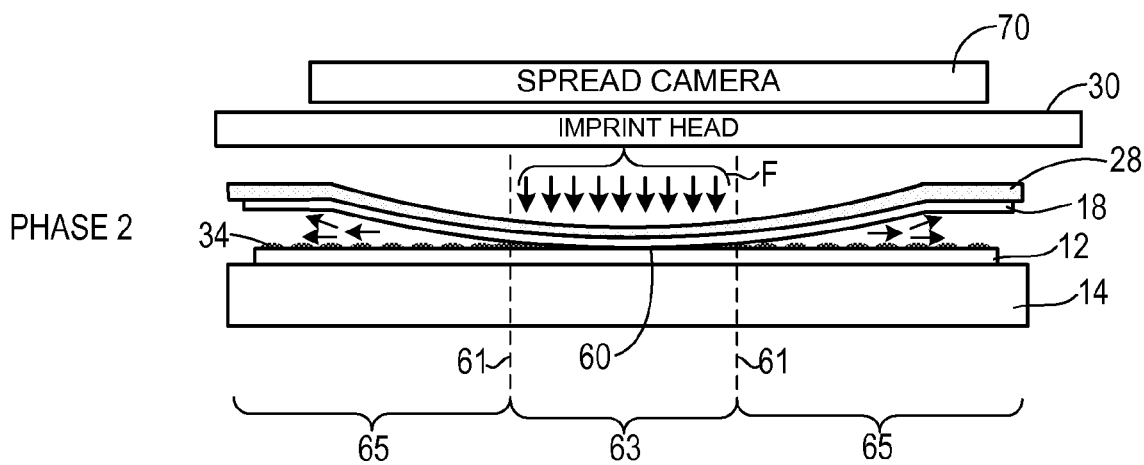
Figure 4:
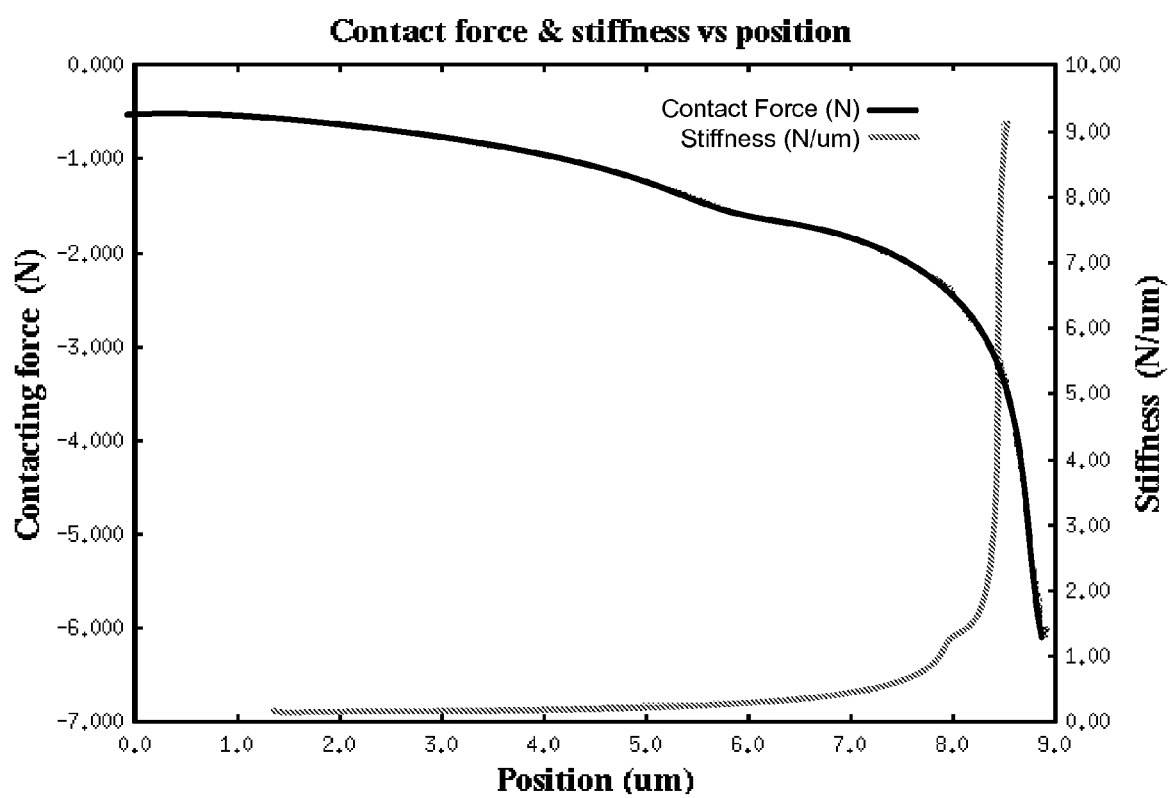
FIG. 4 illustrates a graphical representation of contact force provided by imprint head in relation to stiffness of a template during contact between template and substrate.

During Phase 2, as illustrated in FIG. 3B, template 18 contacts substrate 12. For example, imprint head 30 may provide contact of template 18 to substrate 12. The Z motion of template 18 may be constrained by the stiff environment. For example, the imprint head 30 moving range may be limited by the magnitude of force F that may be possibly generated by the imprint head 30 in addition to the compliance (e.g., stiffness) of template 18 and substrate 12. As illustrated in the graph of FIG. 4, the contact force F gradually increases from zero to 1 N/μm and then quickly increases to 9 N/μm. This contact force F may be proportional to the stiffness of template 18 and/or substrate 12.

Figure 3C:
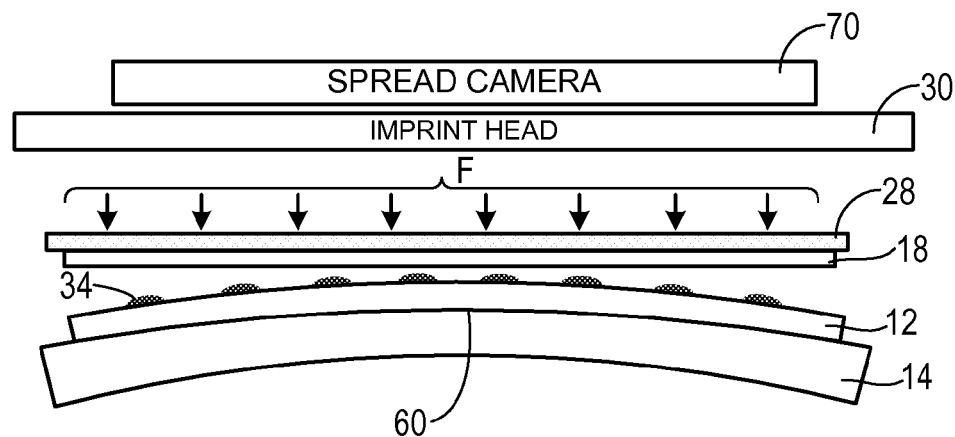
Figure 5:
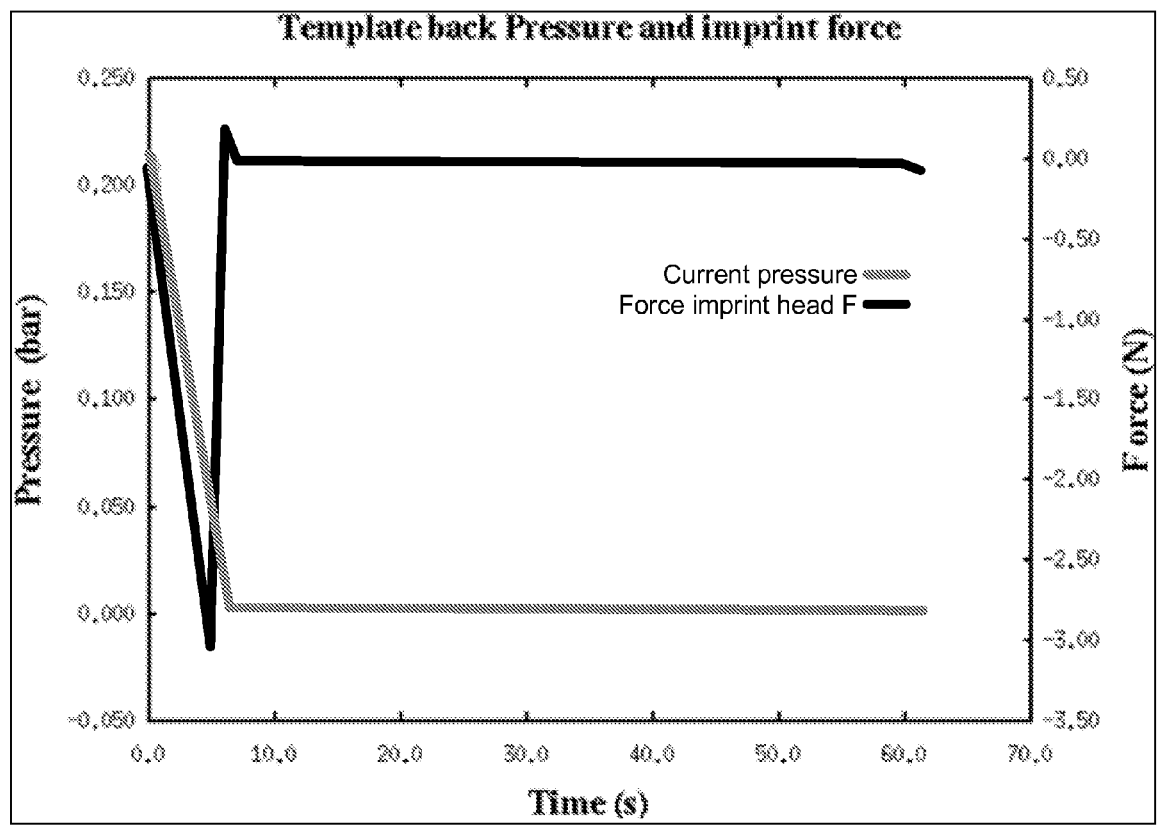
FIG. 5 illustrates a graphical representation of pressure and force distribution on a template.

Back pressure may be applied to template 18 and/or substrate 12. For example, as illustrated in FIGS. 3B and 3C, back pressure may be applied to template 18 by chuck 28 and/or back pressure may be applied to substrate 12 by substrate chuck 14 respectively. As illustrated in FIG. 5, as imprint head 30 increases the magnitude of force F, back pressure provided by chuck 28 and/or chuck 14 may be reduced.

Referring to FIG. 3B, contact plane 60 is the position at which the surface of template 18 and substrate 12 conform to each other. The edge of the contact plane 60 may be defined contact line 61. For example, the contact plane 60 is the position at which mesa 20 contacts the surface of substrate 12 with the contact line 61 defining the edge of the contact plane 60. The contact line 61 generally differentiates a region 63 wherein template 18 and substrate 12 are in contact with a region 65 wherein template 18 and substrate 12 are not in contact.

Referring to FIG. 3B, a real-time multivariable tracking strategy may be used to control the velocity of the motion of the contact line 61 and a height profile adjacent to the contact line 61. The height profile may be defined by the varying distance d between template 18 and substrate 12 within region 65. Generally, motion of the contact line 61 during spread of polymerizable material 34 is a non-linear function of deflection of the substrate 12 and force F provided by imprint head 30.

During imprinting, gas molecules near contact line 61 may be reduced by differential pressures generated by reducing deflection of template 18 and/or application of force F by imprint head 30. The intermolecular attractive forces may also assist in transferring energy to gas molecules in the direction of the motion of contact line 61. For example, intermolecular attractive forces may assist in transferring energy to gas molecules in the direction of the contact line 61 when the distance is less than the radius of the molecular sphere of action (e.g., approximately 50 nm). The height profile near contact line 61 may be modeled as:

$$h(r) = h_o + a(r - r_o)^2$$

wherein a is the coefficient of profile, $h_o$ is the thickness of the residual layer 48, $r_o$ is the radius spread area, and r is the distance from the center. Generally, the pressure along the radius direction may be governed by:

$$p\,dp = -\frac{6m\mu RT}{\pi m_{mol}(h_0 + a(r-r_0)^2)^3 r}dr$$

The pressure distribution ρ may be obtained by integrating both sides of the above equation to provide:

$$p^2 - p_0^2 = -\int_{r_0}^{r} \frac{6m\mu RT}{\pi m_{mol}(h_0 + a(r-r_0)^2)^3 r}dr$$

$$= -\frac{12m\mu RT}{m_{mol}\pi}\left(\frac{\ln\frac{r+r_0}{\sqrt{ar^2+h_0}} + \frac{ar_0}{\sqrt{ah_0}}\mathrm{atan}\left(\frac{ar}{\sqrt{ah_0}}\right)}{h_0^3 + 3ar_0^2h_0^2 + 3a^2r_0^4h_0 + a^3r_0^6} - \right.$$

$$\frac{1+rr_0 + \frac{ar_0 r}{h_0\sqrt{ah_0}\mathrm{atan}\left(\frac{ar}{\sqrt{ah_0}}\right)}}{2(h_0^2 + 2ar_0^2h_0 + a^2r_0^4)(ar^2+h_0)}$$

$$\frac{\frac{arr_0}{h_0} - 1 - \frac{3}{2h_0^2}arr_0}{4(ar_0^2+h_0)(ar^2+h_0)} - \frac{3ar_0\mathrm{atan}\left(\frac{ar}{\sqrt{ah_0}}\right)}{8h_0^2(ar_0^2+h_0)(ar^2+h_0)\sqrt{h_0a}} +$$

$$\left.\frac{a^2r_0^4 + 4ar_0^2h_0 + 2h_0^2\ln\frac{r_0^2}{h_0} + 3h_0^2}{4h_0^2(ar_0^2+h_0)^3}\right)$$

As such, the pressure distribution may be a function of the distance d between template 18 and substrate 12 and gas flow rate (e.g., the steeper the height profile near the contact line 61, the quicker the pressure drop).

There may be a pressure gradient near the contact line 61. Molecules of gas and polymerizable material 34 may be subjected to the pressure gradient. Generally, gases have relatively low densities and viscosities, and as such, gases may be squeezed out of the gap near the contact line 61 by force F and pressure gradients. Liquids, on the other hand, are generally characterized by higher densities and viscosities, and as such, the volumes tend to remain constant by self-association between droplets of polymerizable material 34. The gas pressure gradient and the intermolecular attractive forces between polymerizable material 34 and substrate 12 may drive the spread of polymerizable material 34 laterally and vertically between template 18 and substrate 12 to fill features of template 18. Some of the kinematic energy from the gas molecules may transfer to molecules of polymerizable material 34 as the gas molecules are squeezed out with a high velocity.

Trapped gas molecules surrounding the polymerizable material 34 may have a strong influence on the spreading of droplets of polymerizable material 34 as gas exerts a high pressure on the polymerizable material 34 hindering spread if there is no adequate vent channel to expel gas molecules. This may result in longer spread time during the spreading process of polymerizable material 34.

The venting of gases may be improved by gradually conforming the template 18 to the substrate 12. For example, venting action may be improved by gradually conforming template 18 to substrate 12 from the center of the contact plane 60 outward.

Figure 3D:
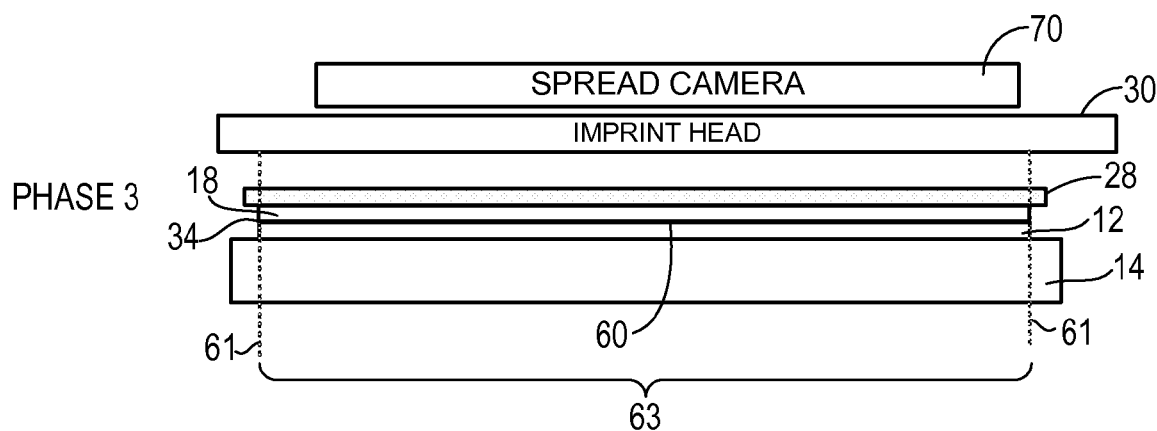

During Phase 3, as illustrated in FIG. 3D, the magnitude of force F provided by imprint head 30 and back pressure provided by chuck 28 and/or substrate chuck 14 may be gradually reduced. For example, the magnitude of force F provided by imprint head 30 and back pressure provided by chuck 28 and/or substrate chuck 14 may be gradually reduced to substantially zero using feedback control. By reducing the force F and back pressure, overlay distortions that may cause extra force may be minimized. For example, it has been demonstrated that a 1 Newton force F may cause 5 nm overlay distortion and 10 kPa template back pressure may cause 7 nm overlay distortion during imprinting of template 18 that are substantially thin. These overlay distortions may be minimized by reducing force F and back pressure prior to and during solidification and/or cross-linking of polymerizable material 34.

Figure 6:
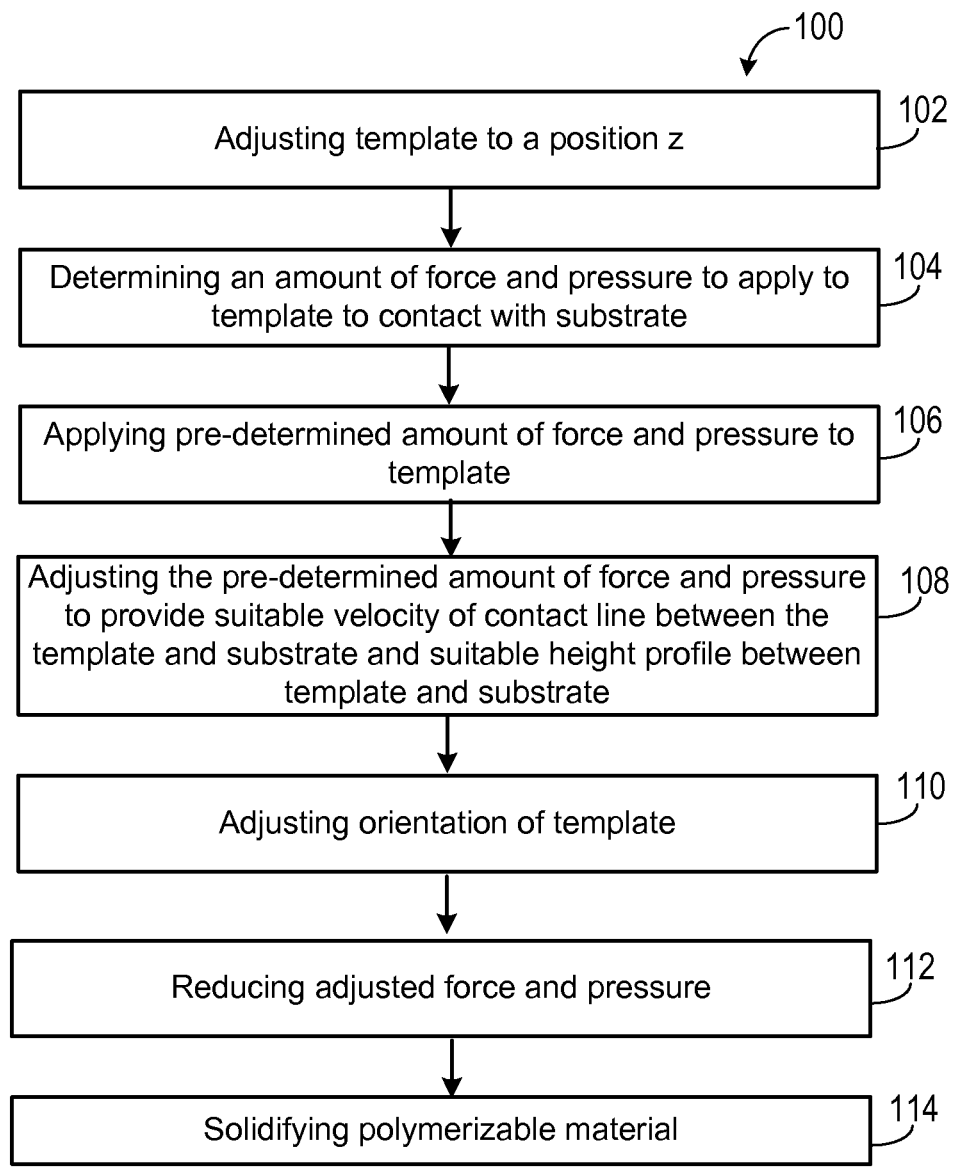
FIG. 6 illustrates a flow chart of an exemplary method for controlling contact transition and conforming of template to substrate.

FIG. 6 illustrates a flow chart of an exemplary method 100 for controlling contact transition and conforming of template 18 to substrate 12. Generally, in a step 102, template 18 may be adjusted to a position z to provide a suitable distance d between template 18 and substrate 12 having polymerizable material 34 on the surface 46 thereof. In a step 104, a pre-determined amount of force and pressure applied to template 18 providing contact between template 18 and substrate 12 may be determined. In a step 106, the pre-determined amount of force and pressure may be applied to template 18 to provide contact between template 18 with substrate 12. In a step 108, the pre-determined amount of force and pressure applied to template 18 may be adjusted to provide an adjusted amount of force and pressure. The adjusted amount of force and pressure may provide suitable contact line velocity and/or suitable height profile. In a step 110, orientation of template 18 may be adjusted such that forces applied by imprint head 30 are within a pre-determined error window. In a step 112, the adjusted amount of force and pressure may be reduced. For example, the adjusted amount of force and pressure may be reduced to zero. In a step 114, polymerizable material 34 may be solidified and/or cross-linked. The following provides a more detailed explanation of the steps described above.

Adjusting Imprint Head

Referring to FIG. 3A, the distance between template 18 and substrate 12 may be adjusted such that template 18 is moved to a position z to provide a suitable distance d between template 18 and substrate 12. Position z is generally higher than the contact plane 60 and provides for little or no contact between template 18 and substrate 12. Position z may be calculated as:

$$z = z_{CONTACT} - \Delta z_p - \Delta z$$

wherein Δz is the error window of the contact plane 60, $\Delta z_p$ is the estimated deflection, and $z_{CONTACT}$ is the estimated contact plane 60.

The error window αz of the contact plane 60 may be determined by estimating the accuracy of the contact plane 60. The estimated accuracy of the contact plane 60 is generally the estimated accuracy of the combined variation in template 18 and substrate 12 thickness. Generally, the error window αz of contact plane 60 may be large enough to avoid any contact when the template 18 is moved adjacent to the substrate 12 under position control of the imprint head 30. It should be noted, however, that contact transition may be increased if there is a large separation distance when template 18 stops movement towards substrate 12.

The estimated deflection $\alpha z_p$ may be based on the applied back pressure to the template 18. For example, the $\alpha z_p$ may be based on the applied back pressure to the template 18 using a calibrated template deflection model.

The estimated contact plane $z_{CONTACT}$ may be first determined by using mechanical dimensions of mechanism design. A more accurate estimate may then be made by gradually reducing the gap between template 18 and substrate 12 until interference fringes are observed by a spread camera 70. For example, when illuminated with energy (e.g., white light), fringes generally are not observed until the separation distance is less than the interference length of the energy (e.g., <1 μm). The contact plane $z_{CONTACT}$ may be measured by recording the position z while maintaining the desired amount of contact force during contact transition.

Control System

Figure 7:
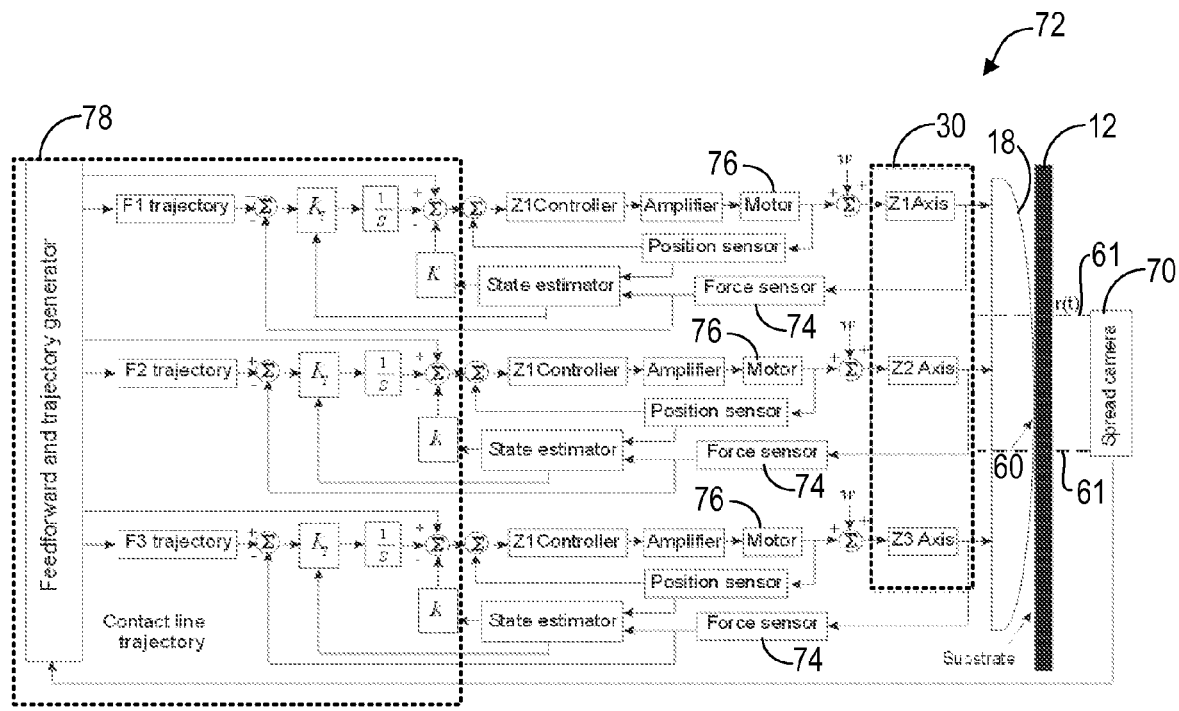
FIG. 7 illustrates a block diagram of an exemplary control system that may be used to provide controlled contact between template and substrate.

FIG. 7 illustrates a block diagram of a control system 72 that may be used to decrease the moving velocity of the imprint head 30 to provide controlled contact between template 18 and substrate 12. Mapping between contact force F and length of contact line 61 may be calibrated using spread camera 70 to provide contact force trajectory. Generally, by tracking the profile of the contacting force, a substantially constant velocity of contact line 61 may be maintained providing a smooth transition as template 18 contacts substrate 12. This may void latency that can affect uniformity of the residual layer 48 (shown in FIG. 2).

Generally, the control system 72 may provide contact of template 18 with substrate 12 by gradual reduction of the gap between template 18 and substrate. Control system 72 may include force sensors 74 capable of measuring the contact force F applied by imprint head 30 at different locations. Force sensors 74 may be in communication with controller 78 and provide a first signal (input signal) to controller 78. Controller 78 receives the first signal providing information regarding the force and pressure applied to template 18 and uses this information to provide a second signal (output signal) having an adjusted force and pressure to position actuators 76 of imprint head 30.

A combination of integral action and feedback control may be used to provide the adjusted force and pressure to position actuators 76. Generally, the state of the contact line 61 may be estimated based on a mechanical dimensions of mechanism design in addition to the measured position of the imprint head 30 and contact force F and pressure. Variations of the contact plane 60 may be canceled by the integral action. The error of the contact force F, therefore, may be substantially equal to the set-point force reduced by the measured force as the contact forces may be approaching zero prior to contact of template 18 with substrate 12. The contact force F may be integrated and the actuating signal may be proportional to the integral of the error. This signal may continue to accumulate as the imprint head 30 progresses toward the substrate 12. As template 18 contacts substrate 12, as illustrated in FIG. 3B, the contract force F may converge to a setpoint value such that the contact force F may cancel the error of the contact line 61 estimate.

Figure 8:
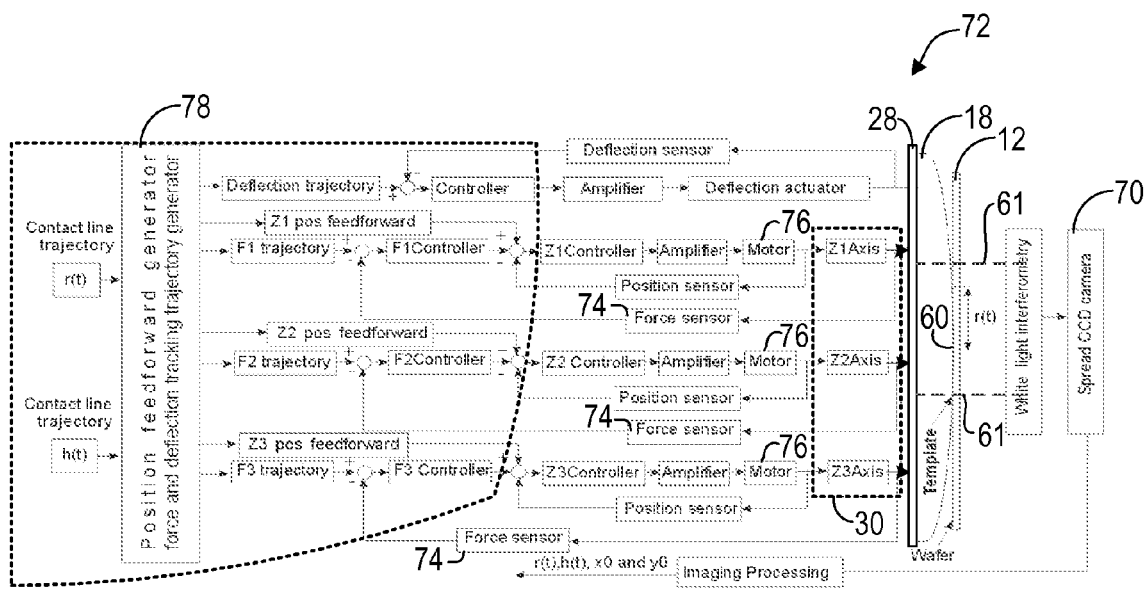
FIG. 8 illustrates a block diagram of another exemplary control system that may be used to provide controlled contact between template and substrate.

FIG. 8 illustrates a block diagram of another exemplary control system 72a. Moving velocity of the contact line 61 and the height profile near contact line 61 may be controlled by adjusting magnitude of force F of imprint head 30 and/or pressure provided by chuck 28 and/or substrate chuck 14. The magnitude of force F and/or pressure provided by imprint head 30 and chuck 28 respectively may be based on a physical model related to the spread of polymerizable material 34. Controller 78 may evaluate applied force F and/or pressure based on the physical model to provide the adjusted magnitude of force F and pressure. The adjusted magnitude of force F and/or pressure may be provided to actuators 76 and/or chuck 28. For example, control of force F may be implemented by adjusting position of imprint head 30 using a cascaded control scheme.

The contact line 61 and the height profile near the contact plane 60 may be measured using spread camera 70. For example, contact line 61 during fluid spread of polymerizable material 34 may be measured using white light interferometry. The white light may contain all visible wavelengths, λ=400 nm-700 nm, from an LED array that illuminated substrate 12 through template 18. Some incident beams may reflect and/or deflect from substrate 12 off of template 18. These reflected beams may interfere and the resulting beam interference pattern may be provided in an image (e.g., an image on a CCD screen). The light intensity of the image may vary following coherence function of the light source. This observed light intensity may vary as a function of the distance d (also herein referred to as gap height) between template 18 and substrate 12 as described by:

$$I(h) = I_O\left(1 + e^{-\left(\frac{h}{l_C}\right)^2}\cos\left(\frac{4\pi h}{\lambda_C}\right)\right)$$

wherein I is the light intensity on the CCD, h is the gap height between template 18 and substrate 12, $\lambda_c$ is the central wavelength of white light (e.g., 0.5 μm), and $l_c$ is the coherence length of white light (e.g., 1.2 μm).

Figure 9:
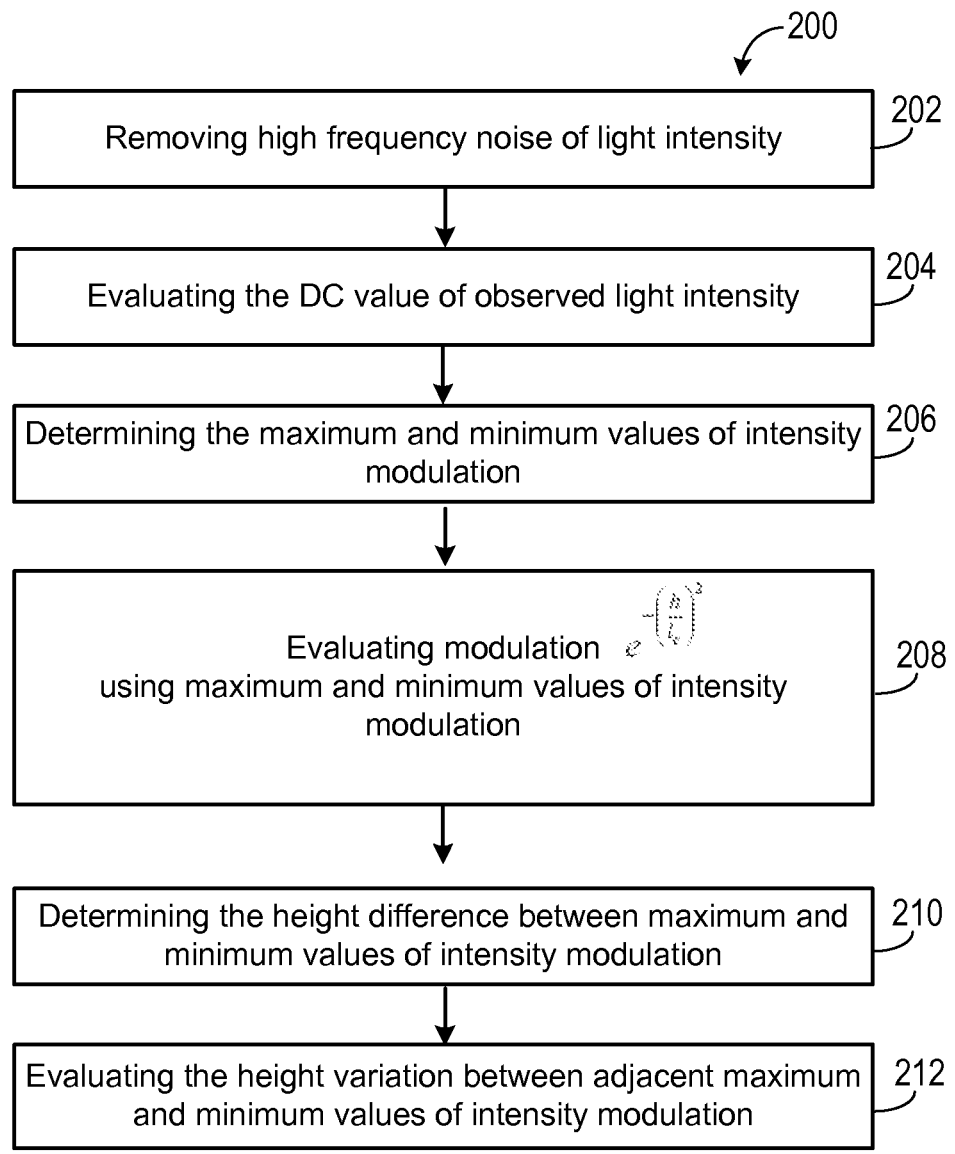
FIG. 9 illustrates a flow chart of an exemplary method for determining height profile of a contact plane between template and substrate.
Figure 10:
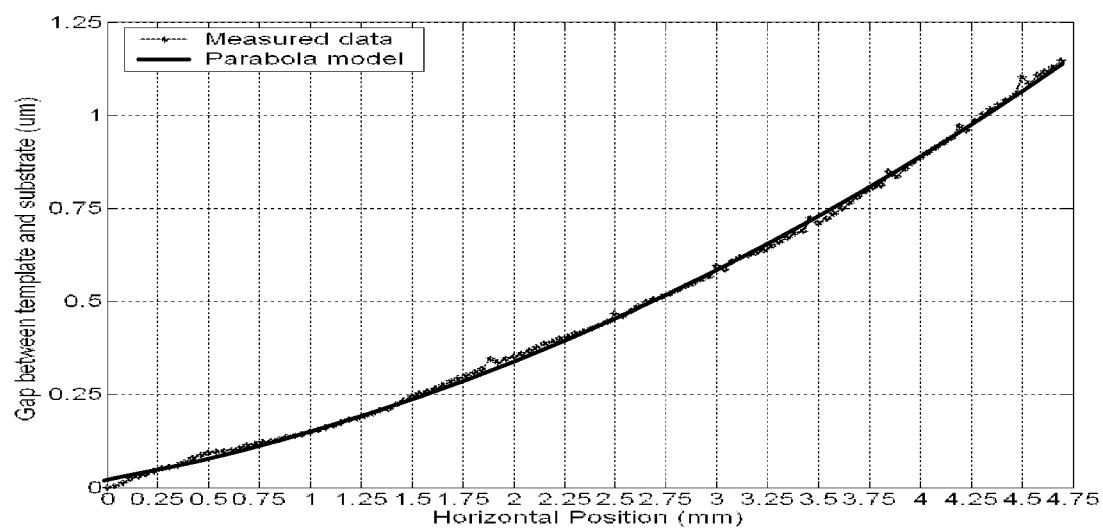
FIG. 10 illustrates a graphical representation of a height profile near contact plane between template and substrate.

FIG. 9 illustrates a flow chart of an exemplary method 200 for determining height profile near the contact line 61 using the image provided by the spread camera 70. In a step 202, high frequency noise of observed light intensity may be removed using a low pass filter. In a step 204, the DC value of light intensity $l_o$ may be evaluated. For example, the DC value of light intensity $l_o$ may be evaluated by averaging observed light intensity l(h). In a step 206, the maximum value and minimum value of intensity modulation may be determined (e.g., peak and valley). In a step 208, modulation $$e^{-\left(\frac{h}{l_C}\right)^2}$$

may be evaluated using the maximum value and minimum value of intensity modulation. In a step 210, the height difference between the maximum value and minimum value of intensity modulation may be determined. In a step 212, the height variation (or phase change) between adjacent maximum value and minimum value of intensity modulation may be evaluated. FIG. 10 illustrates a graphical representation of an exemplary height profile near contact line 61.

Figure 11:
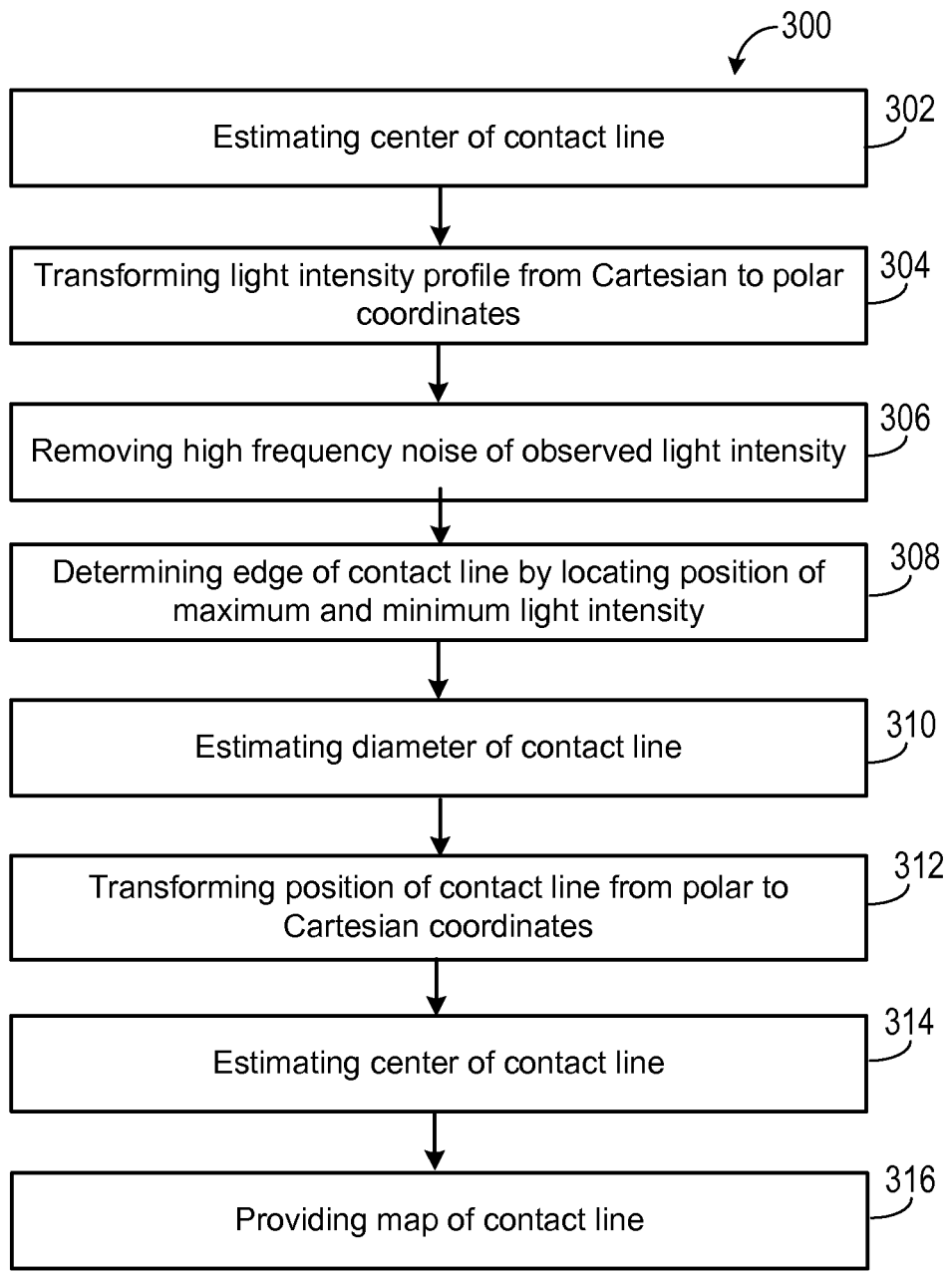
FIG. 11 illustrates a flow chart of an exemplary method for obtaining a contact plane.
Figure 12:
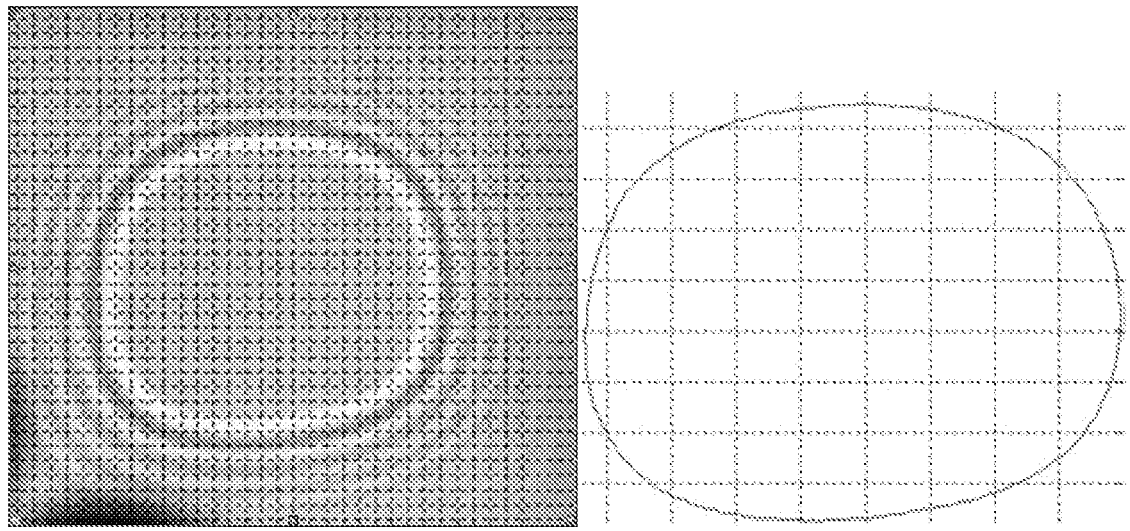
FIG. 12 illustrates a side-by-side comparison of an image of a contact plane obtained from a spread camera and an associated map of the contact plane.

FIG. 11 illustrates a flow chart of an exemplary method 300 for obtaining a map of contact line 61 using the image provided by spread camera 70. In a step 302, center of contact line 61 may be estimated. In a step 304, if needed, light intensity profile obtained by spread camera 70 may be transformed from Cartesian to polar coordinates. In a step 306, high frequency noise of observed light intensity may be removed. For example, high frequency noise of observed light intensity may be removed by using a low pass filter. In a step 308, at least one edge of contact line 61 may be determined by locating the position of maximum and minimum light intensity. In a step 310, the diameter of the contact line 61 may be estimated. In a step 312, if needed, position of contact line 61 may be transformed from polar to Cartesian coordinates. In a step 314, the center of contact line 61 may be estimated. In a step 316, map of contact line 61 obtained by image provided by spread camera may be provided. A side-by-side comparison of an exemplary image of contact line 61 obtained from spread camera 70 and the associated map of the contact line 61 is illustrated in FIG. 12.

Figure 14:
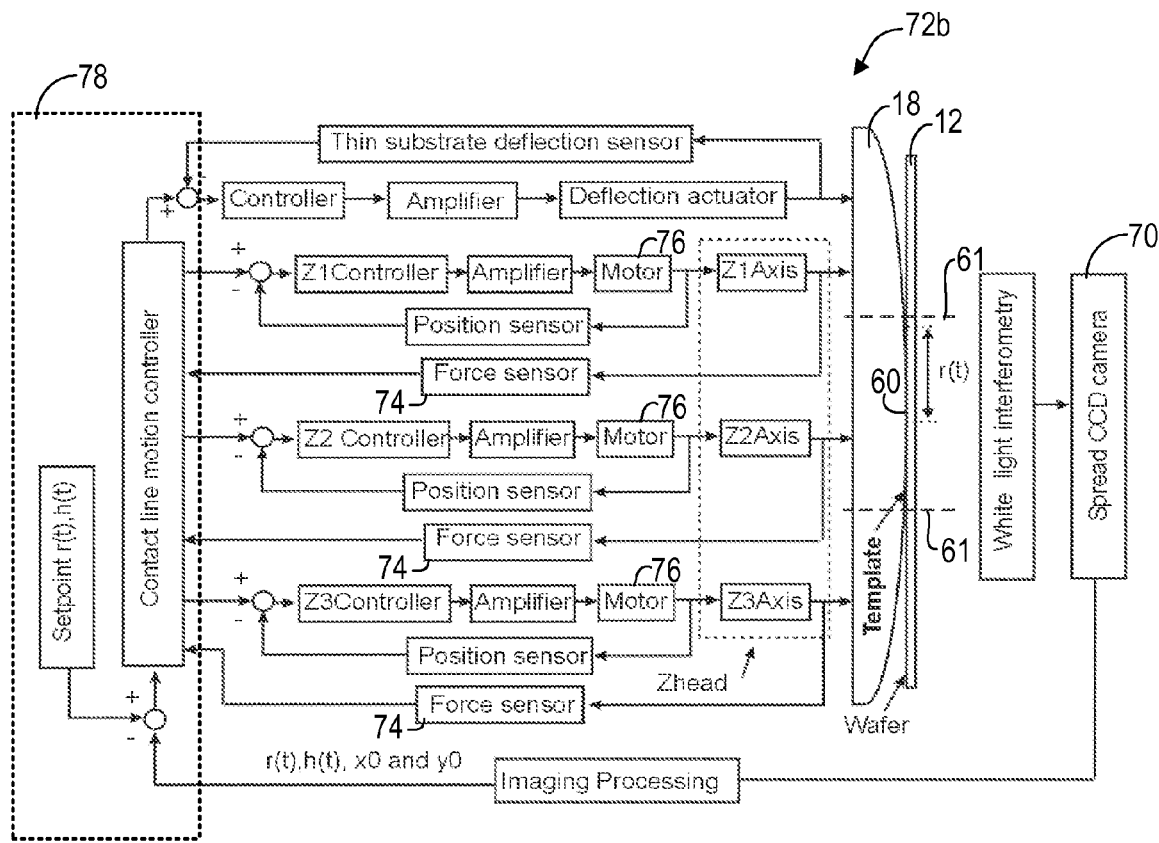
FIG. 14 illustrates another exemplary control system that may be used to provide controlled contact line motion between template and substrate in substantially real time.

FIG. 14 illustrates another exemplary embodiment of a control system 72c. Generally, spread camera 70 may provide at least one image. Image may undergo image processing to determine velocity of the contact line 61 between template 18 and substrate 12 and height profile near contact line 61. For example, velocity of contact line 61 and height profile may be determined using white light interferometry. The velocity of the contact line 61 between template 18 and substrate 12 and height profile near contact line 61 may be used by controller 78 to adjust imprint head 30, chuck 28, and/or substrate chuck 14 to provide controlled contact between template 18 and substrate 12.

Orientation of Template

Referring to FIGS. 7 and 8, after template 18 contacts substrate 12, orientation of template 18 may be adjusted such that forces applied by imprint head 30 to template 18 are within a pre-determined error window. Generally, contact forces observed from force sensors 74 may be combined with distances between sensing locations and a central contact point to determine orientation of template 18 at the initial set point. For example, controller 78 may be used to adjust the orientation of the template 18 by adjusting three axis z positions until the difference among the forces is within a pre-determined error window. Additionally, template 18 may be adjusted such that template 18 and substrate 12 are substantially co-planar and template 18 is substantially parallel to substrate 12. This may be further verified by observation with spread camera 70.

Solidification/Cross-Linking of Polymerizable Material

After template 18 and substrate 12 conform, the magnitude of force and pressure applied to template 18 may be gradually reduced. For example, the magnitude of force and pressure applied to template 18 may be gradually reduced to zero. Reduction of the magnitude of force and pressure may be based on information provided by control system 72.

With the magnitude of force and pressure reduced, polymerizable material 34 on the surface 46 of substrate 12 may then be solidified and/or cross-linked. As previously discussed, the reduction in force and pressure may reduce overlay distortions.

Template Loading

Figure 13:
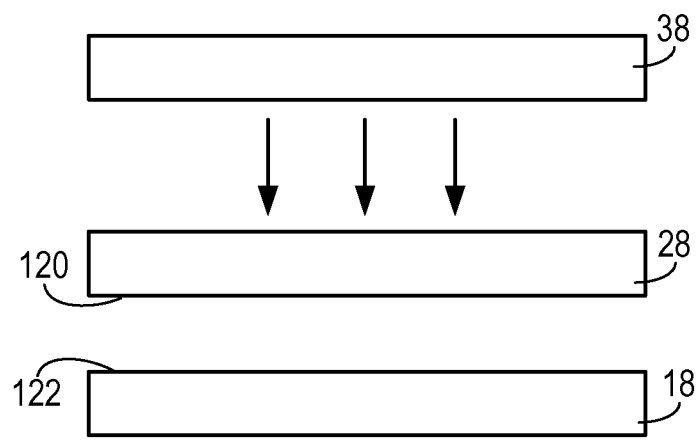
FIG. 13 illustrates a simplified side view of a chuck contacting a template and defining a contact plane.

It should be noted that systems and methods described herein may be applied to the loading of templates 18. Variations in the parallelism errors between chuck 28 and template 18 may be minimized using closed loop control during loading of template 18. The low contact force may prevent potential damage of template 18. For example, as illustrated in FIG. 13, the vacuum land surface 120 of chuck 28 may be moved to a position close to the surface 122 of template 18. The contact plane may be detected and orientation of imprint head 30 may be adjusted to make vacuum land surface 120 of chuck 28 conform to surface 122 of template 18 with minimum contact force. Template 18 may then be transferred and secured by chuck 28 by turning on vacuum of chuck 28.

In using the systems and methods described herein in the loading of template 18, generally, the position z, $R_x$ and $R_y$ may not need to be accurately registered. For example, low contact forces, limited by force measurement accuracy, may be sufficient to automatically detect where and when the template 18 contacts an object. As such, the reliability in loading template 18 may be increased.

What is claimed is:

1. A method for controlling contact transition and conformation between a template and substrate during imprinting of polymerizable material disposed on a surface of the substrate, the method comprising:

providing a distance between the template and substrate;

applying to the template a predetermined back pressure and predetermined force by a template chuck and imprint head respectively so as to gradually contact the template with the substrate and provide an advancing contact line therebetween;

using a controller to process an image of the contact line and determine a height profile and velocity of the contact line, the height profile defined by a varying distance in the form of curvature of a template region adjacent to but not contacting the substrate;

based on the determined height profile and contact line velocity, providing an output signal from the controller having an adjusted back pressure and adjusted force; and applying the adjusted back pressure and adjusted force to the template by the template chuck and imprint head respectively so as to provide an adjusted contact line velocity and adjusted height profile.

2. The method of claim 1, wherein the output signal is also based on processed information regarding applied force and applied pressure between the template and substrate.

3. The method of claim 1 further comprising adjusting template orientation so that the adjusted force and back pressure are within a predetermined error window.

4. The method of claim 1 further comprising solidifying the polymerizable material.

5. The method of claim 4 further comprising reducing the adjusted force and back pressure.

6. The method of claim 5, wherein the adjusted force and back pressure are reduced to substantially zero.

7. The method of claim 6, wherein said reduction to substantially zero is conducted prior to said solidifying.

8. The method of claim 1, wherein said control of contact transition and conformation is performed directly in substantially real time.

9. The method of claim 1, wherein said control of contact transition and conformation is provided by a feedback scheme.

10. The method of claim 1, wherein the image is provided by a spread camera, and wherein said determining further comprises evaluating the provided image.

11. The method of claim 10, wherein said evaluating further comprises:

removing high frequency noise of light intensity from the image;

evaluating a DC value of the light intensity;

determining maximum and minimum intensity modulation; and evaluating maximum and minimum intensity modulation to determine phase change.

12. The method of claim 10, wherein said evaluating further comprises:

determining an estimated center of the contact line;

removing high frequency noise of observed light intensity form the image;

locating maximum and minimum light intensities in the image to provide an edge location of the contact line;

determining an estimated diameter of the contact line based on the contact line edge location; and providing a map of the contact line based on the estimated center and diameter thereof.

* * * * *